(12) United States Patent
Annis et al.

(10) Patent No.: US 9,590,337 B2
(45) Date of Patent: Mar. 7, 2017

(54) ELECTRICAL CONNECTOR HAVING WAFERS

(71) Applicant: Tyco Electronics Corporation, Berwyn, PA (US)

(72) Inventors: Kyle Gary Annis, Hummelstown, PA (US); Lynn Robert Sipe, Mifflintown, PA (US); Dustin Carson Belack, Hummelstown, PA (US); Matthew Richard McAlonis, Elizabethtown, PA (US); Graham Harry Smith, Jr., Mechanicsburg, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 14/736,895

(22) Filed: Jun. 11, 2015

(65) Prior Publication Data

US 2016/0365661 A1    Dec. 15, 2016

(51) Int. Cl.
| | |
|---|---|
| *H01R 13/40* | (2006.01) |
| *H01R 12/79* | (2011.01) |
| *H01R 13/52* | (2006.01) |
| *H01R 13/6581* | (2011.01) |

(52) U.S. Cl.
CPC ......... *H01R 12/79* (2013.01); *H01R 13/5202* (2013.01); *H01R 13/6581* (2013.01)

(58) Field of Classification Search
CPC . H01R 12/79; H01R 13/6581; H01R 13/5202

USPC ....... 439/587, 589, 274, 275, 279, 492, 493, 439/329
See application file for complete search history.

(56) References Cited

U.S. PATENT DOCUMENTS

| | | |
|---|---|---|
| 4,116,516 A | 9/1978 | Griffin |
| 4,828,512 A | 5/1989 | McCormick et al. |
| 5,667,401 A | 9/1997 | Kuwabara |
| 6,930,240 B1 | 8/2005 | Giboney et al. |
| 7,544,087 B2 * | 6/2009 | Homer ................. H01R 4/5066 439/492 |
| 2007/0184682 A1 | 8/2007 | Gobron |

FOREIGN PATENT DOCUMENTS

| | | |
|---|---|---|
| KR | 101 500 518 B1 | 3/2015 |
| WO | 2008 120513 A1 | 10/2008 |
| WO | 2013 141858 A1 | 9/2013 |

OTHER PUBLICATIONS

Machine translation of WO 2008 120513 dated Aug. 29, 2016.*
International Search Report, International Application No. PCT/US2016/035385, International Filng Date, Jun. 21, 2016.

* cited by examiner

*Primary Examiner* — Javaid Nasri

(57) ABSTRACT

An electrical connector includes a housing having a cavity. A wafer stack is received in the cavity. The wafer stack includes a plurality of electrical wafers arranged parallel to each other within the cavity. Each wafer includes a first edge and a second edge. Each wafer includes at least one trace between the first and second edges. The electrical connector includes a flex harness including a plurality of flexible printed circuit boards (FPCBs). The FPCBs are electrically connected to corresponding wafers.

20 Claims, 12 Drawing Sheets

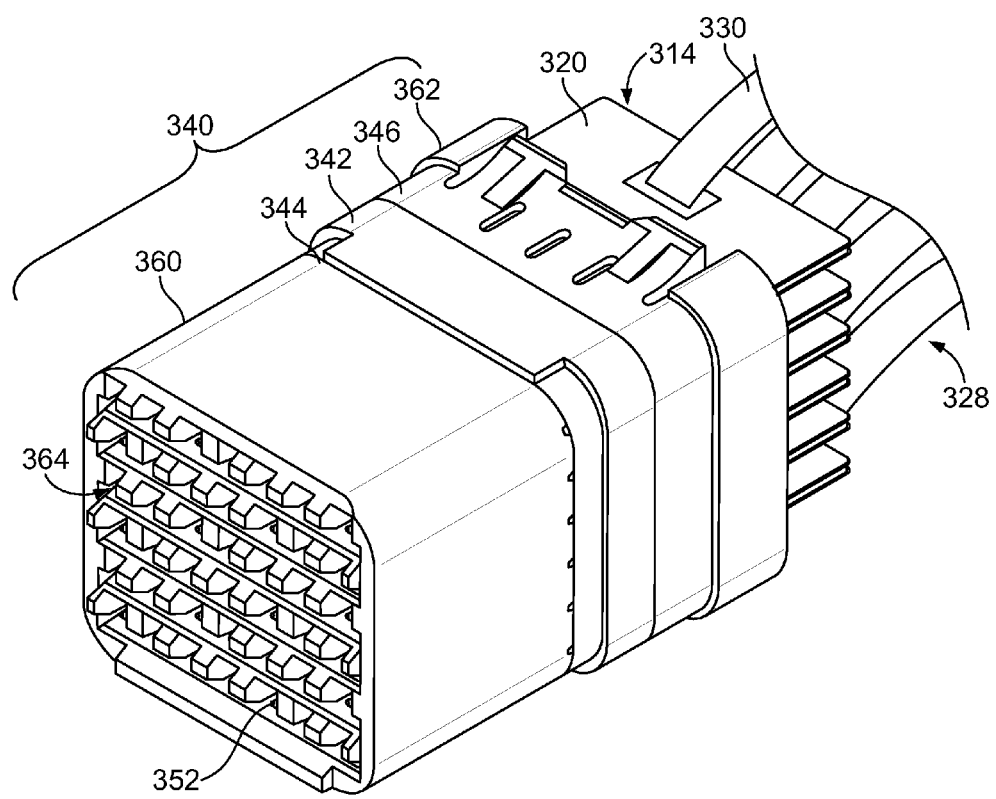
FIG. 4
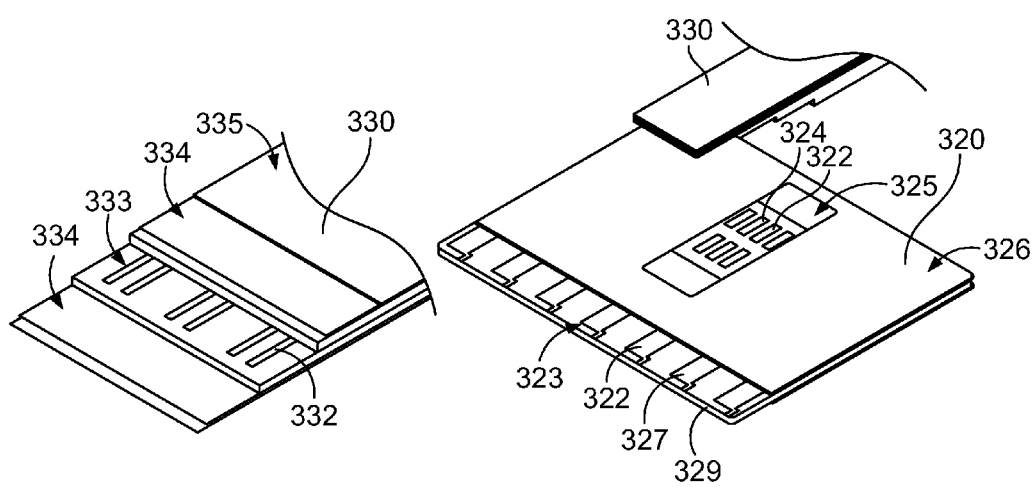
FIG. 5
FIG. 6

ELECTRICAL CONNECTOR HAVING WAFERS

BACKGROUND OF THE INVENTION

The subject matter herein relates generally to electrical connectors having wafers.

Modern electronic systems such as telecommunications systems and computer systems often include large circuit boards called backplane boards which are rack mounted or retained in cabinets and are electrically connected to a number of smaller circuit boards called daughter cards. Electrical connectors establish communications between the backplane and the daughter cards. The daughter cards are typically separate from each other and meet different requirements for different purposes such as transmission of high speed signals, low speed signals, power, etc. that are transferred to the daughter cards from the backplane board. Cable connectors are typically electrically connected to various electrical connectors within the system. However, as the density of such systems increase, the number of cables increases. The cables add weight to the system and occupy a large amount of space. In some applications, such as military and aerospace applications, weight reduction and space reduction are important.

A need exists for a connector system that is cost effective and reliable that may provide a weight reduction and/or a space reduction.

BRIEF DESCRIPTION OF THE INVENTION

In one embodiment, an electrical connector is provided including a housing having a cavity. A wafer stack is received in the cavity. The wafer stack includes a plurality of electrical wafers arranged parallel to each other within the cavity. Each wafer includes a first edge and a second edge. Each wafer includes at least one trace between the first and second edges. The electrical connector includes a flex harness including a plurality of flexible printed circuit boards (FPCBs). The FPCBs are electrically connected to corresponding wafers.

In another embodiment, an electrical connector is provided including a housing having a cavity. A wafer stack is received in the cavity. The wafer stack includes a plurality of electrical wafers arranged parallel to each other within the cavity. Each wafer includes a first edge and a second edge. Each wafer includes at least one trace between the first and second edges. Each trace has a first pad and a second pad. A contact sub-assembly is terminated to the wafer stack. The contact sub-assembly includes a rigid printed circuit board (RPCB) having a first side and a second side. The contact sub-assembly includes wafer contacts extending from the first side of the RPCB and mating contacts extending from the second side of the RPCB. The contact sub-assembly is terminated to the wafer stack such that the wafer contacts are terminated to the first pads of corresponding traces of the wafers of the wafer stack. The electrical connector includes a flex harness including a plurality of flexible printed circuit boards (FPCBs). The FPCBs have traces and the FPCBs are terminated to the contact sub-assembly such that the traces are electrically connected to the second pads of corresponding traces of the wafers of the wafer stack.

In a further embodiment, an electrical connector is provided including a housing having a cavity. A wafer stack is received in the cavity. The wafer stack includes a plurality of electrical wafers arranged parallel to each other within the cavity. Each wafer includes a first edge and a second edge. Each wafer includes at least one trace between the first and second edges. The electrical connector includes a contact sub-assembly terminated to the wafer stack. The contact sub-assembly includes a rigid printed circuit board (RPCB) having a first side and a second side. The contact sub-assembly includes wafer contacts extending from the first side of the RPCB and mating contacts extending from the second side of the RPCB. The contact sub-assembly is terminated to the wafer stack such that the wafer contacts are terminated to corresponding traces of the wafers of the wafer stack. The electrical connector includes a flex harness having a plurality of flexible printed circuit boards (FPCBs). The FPCBs has traces. The FPCBs are terminated to the contact sub-assembly such that the FPCB traces are electrically connected to corresponding mating contacts of the connector sub-assembly. The traces of the FPCBs are electrically connected to corresponding traces of the wafers via the contact sub-assembly.

BRIEF DESCRIPTION OF THE DRAWINGS

FIG. 4 is a front perspective view of a portion of the electrical connector shown in FIG. 3.

FIG. 5 illustrates an exemplary flexible printed circuit board (FPCB) of the electrical connector in accordance with an exemplary embodiment.

FIG. 6 shows the FPCB being terminated to a wafer of the electrical connector in accordance with an exemplary embodiment.

DETAILED DESCRIPTION OF THE INVENTION

Figure 1:
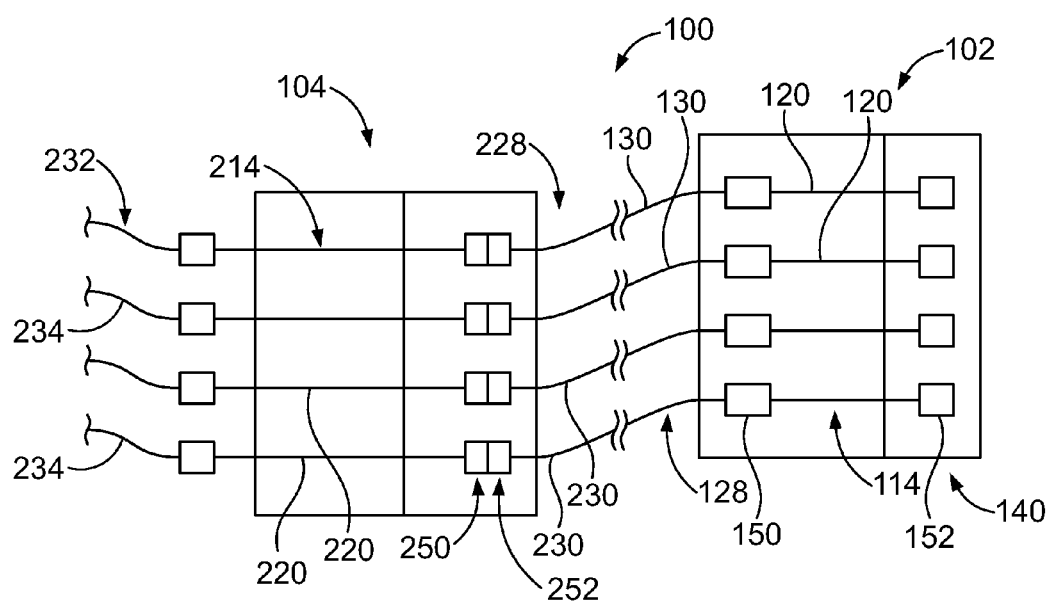
FIG. 1 is a schematic illustration of a connector system formed in accordance with an exemplary embodiment.

FIG. 1 is a schematic illustration of a connector system 100 formed in accordance with an exemplary embodiment. The connector system 100 includes a first electrical connector 102 and a second electrical connector 104 configured to be electrically connected to the first electrical connector 102. In an exemplary embodiment, the electrical connectors 102, 104 are high-speed and high density electrical connectors. The electrical connectors 102, 104 may be used as part of a computer system or a communication system, such as a backplane system, or other systems such as sensor devices. The electrical connectors 102, 104 may be electrically connected to a backplane circuit board, a daughtercard circuit board, a switch card, a line card or another electronic device. The connector system 100 may have use in various applications, including aerospace applications and military applications where weight concerns are important. In an exemplary embodiment, the connector system 100 is part of a flexible communication system where various components may be interconnected by flexible printed circuit boards (FPCBs). For example, in the illustrated embodiment, the first and second electrical connectors 102, 104 are electrically connected via FPCBs.

The FPCBs allow flexibility in the design and system layout. The electrical connectors 102, 104 establish communication between the various components. The connector system 100 may be designed to meet different requirements for different purposes such as transmission of high speed signals, low speed signals, power, and the like between the various components. Because connector space may be limited on circuit boards, the FPCBs allow electrical connection without the need for one or more circuit boards. For example, midplane boards, daughtercards and/or backplanes may be eliminated in the communication system with the use of the FPCBs.

The electrical connectors 102, 104 offer flexibility and customization within the connector system 100 by using modular components which can be used in a variety of combinations. For example, the electrical connectors 102, 104 use the FPCBs to route between various components or connectors. The electrical connectors 102, 104 use printed circuit electrical wafers at mating interfaces thereof. The electrical connectors 102, 104 provide a flexible platform to provide the density, data throughput, and signal integrity required for various applications in computer, communications, military, medical, industrial control or other industries. The use of the printed circuit electrical wafers allows for cost effective sequencing and electrical customization of the connectors 102, 104. The wafers can be manufactured specifically for differential or signal ended performance and the impedance, propagation delay, and crosstalk of the connector can be altered per customer requirements. The electrical connectors 102, 104 are scalable and may include any number of wafers, such wafers may be signal wafers, power wafers or signal and power wafers. The wafers are not necessarily all of the same type; and further, each can be functionally independent of the others. That is, the connectors 102, 104 can include a mix of electrical wafers that perform different functions. The connectors 102, 104 can be customized to a particular need simply by loading the appropriate wafers in a particular slot or location in the connector 102, 104. For instance, in an exemplary embodiment, the connectors 102, 104 may be configured to carry signal information on some wafers and also transfer power on other wafers. Further, in various embodiments, the signal wafers may be high density signal wafers, low density signal wafers and/or hybrid signal wafers configured to carry both high speed signals and low speed signals. In addition, the signal wafers may carry different numbers of signal lines.

In an exemplary embodiment, the electrical connector 102 includes a wafer stack 114 having a plurality of electrical wafers 120 arranged parallel to each other. Each wafer 120 includes traces extending between a first edge and a second edge (and optionally a third edge or more edges). The traces may include pads at or near the first and second edges for electrical terminations to the traces. Optionally, the edges may be perpendicular to each other. Alternatively, the edges may be at opposite sides from each other and thus define a straight pass through the wafer 120 of the power or signal.

The electrical connector 102 includes a flex harness 128 including a plurality of FPCBs 130. The FPCBs 130 are electrically connected to corresponding wafers 120 at mating interfaces 150. The FPCBs 130 may include traces, such as signal traces, ground traces, power traces and the like. Optionally, as in the illustrated embodiment, the FPCBs 130 may be soldered directly to the wafers 120 at the interfaces 150. For example, the traces of the FPCBs 130 are electrically connected to the pads of corresponding traces of the wafers 120 of the wafer stack 114, such as at the second edge. Alternatively, the FPCBs 130 may be electrically connected to the wafers 120 via one or more contact sub-assemblies at the mating interfaces 150. For example, the contact sub-assembly(ies) may be terminated to the wafers 120 and the FPCBs 130 may be connected to the contact sub-assembly(ies).

In an exemplary embodiment, the electrical connector 102 includes at least one contact sub-assembly 140 configured to be terminated to the wafer stack 114. In the illustrated embodiment, a single contact sub-assembly 140 is terminated to the wafer stack 114 as a unit; however, in alternative embodiments, individual contact sub-assemblies 140 may be separately terminated to each corresponding wafer 120. The contact sub-assembly 140 may includes a rigid printed circuit board (RPCB) with contacts extending from either or both sides. In an exemplary embodiment, the contact sub-assembly 140 is terminated to the wafer stack 114 such that the contacts are terminated to the corresponding traces of the wafers 120 at corresponding mating interfaces 152. The contacts may be terminated to other components, such as a circuit board (e.g., a backplane), another electrical connector, another flex harness, a cable harness, and the like. The contacts may define separable interfaces (e.g., spring beams) or a permanent interfaces (e.g., press-fit pins, crimp barrels, solder pads or solder tails).

The electrical connector 104 includes a wafer stack 214 having a plurality of electrical wafers 220 arranged parallel to each other. Each wafer 220 includes traces extending between edges of the wafer 220. The traces may include pads at or near the corresponding edges for electrical terminations to the traces. Optionally, the edges may be perpendicular to each other. Alternatively, the edges may be at opposite sides from each other and thus define a straight pass through the wafer 220 of the power or signal.

The electrical connector 104 includes at least one contact sub-assembly 240 terminated to the wafer stack 214. In the illustrated embodiment, a single contact sub-assembly 240 is terminated to the wafer stack 214 as a unit; however, in alternative embodiments, individual contact sub-assemblies 240 may be separately terminated to each corresponding wafer 220. In an exemplary embodiment, the contact sub-assembly 240 includes a RPCB and contacts extending from the RPCB. The contact sub-assembly 240 is terminated to the wafer stack 214 such that the contacts are terminated to corresponding traces of the wafers 220 at mating interfaces 250. Optionally, one or more of the edges of each of the wafers 220 may define separable interfaces with the contacts of the contact sub-assembly 240.

The electrical connector 104 includes a flex harness 228 having a plurality of FPCBs 230. The contact sub-assembly 240 is provided between the flex harness 228 and the wafer stack 214 and provides the electrical connection therebetween. Each FPCB 230 may be separately terminated to the contact sub-assembly 240 at corresponding mating interfaces 252. The FPCBs 230 have traces. The FPCBs 230 are terminated to the contact sub-assembly 240 such that the traces are electrically connected to corresponding contacts of the contact sub-assembly 240 at the mating interfaces 252. The traces of the FPCBs 230 are electrically connected to corresponding traces of the wafers 220 via the contact sub-assembly 240.

Optionally, the electrical connector 104 may include a second flex harness 232 comprising a plurality of FPCBs 234. The FPCBs 234 of the second flex harness 232 may be electrically connected to the FPCBs 230 of the first flex harness 228 via the wafers 220. For example, the FPCBs 234 of the second flex harness 232 may be directly terminated to the wafers 220, such as being soldered to the wafers 220 or attached at separable interfaces, such as via spring contacts.

Figure 2:
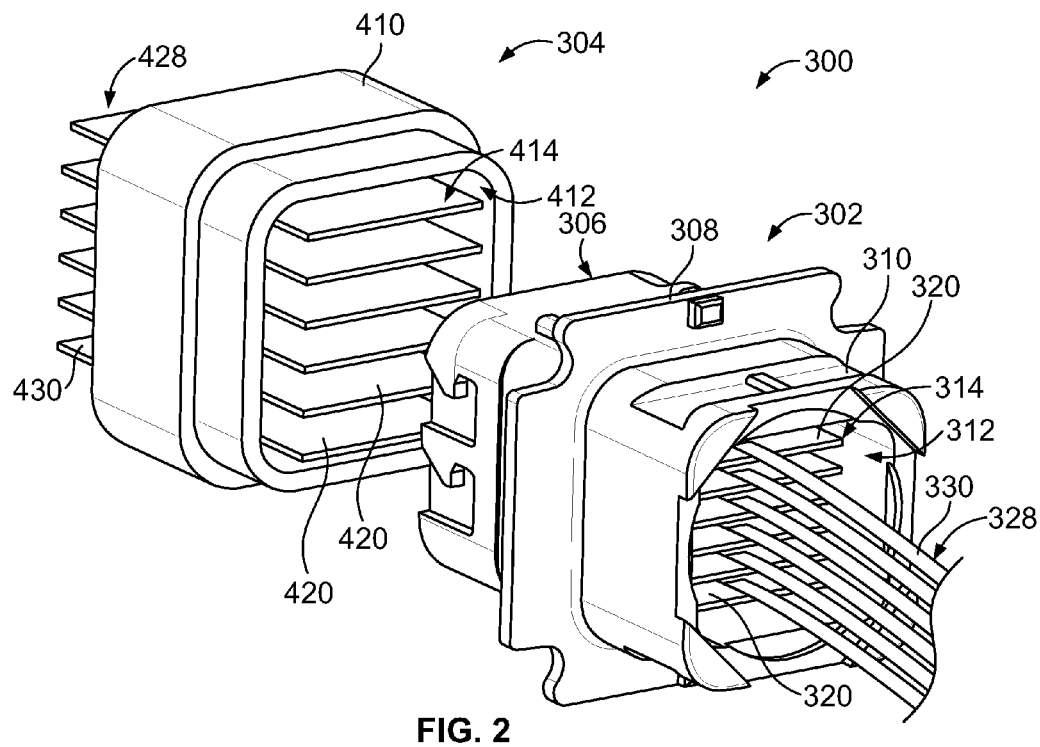
FIG. 2 illustrates a connector system formed in accordance with an exemplary embodiment.

FIG. 2 illustrates a connector system 300 formed in accordance with an exemplary embodiment. The connector system 300 includes a first electrical connector 302 and a second electrical connector 304 configured to be electrically connected to the first electrical connector 302. In an exemplary embodiment, the electrical connectors 302, 304 are modular rectangular connectors for use in aerospace or military applications and may have size, shape and mating interface requirements corresponding to the European standardized EN4165 connectors. For example, the electrical connectors 302, 304 may have features similar to DMC-M connectors designed and developed by TE Connectivity.

Figure 3:
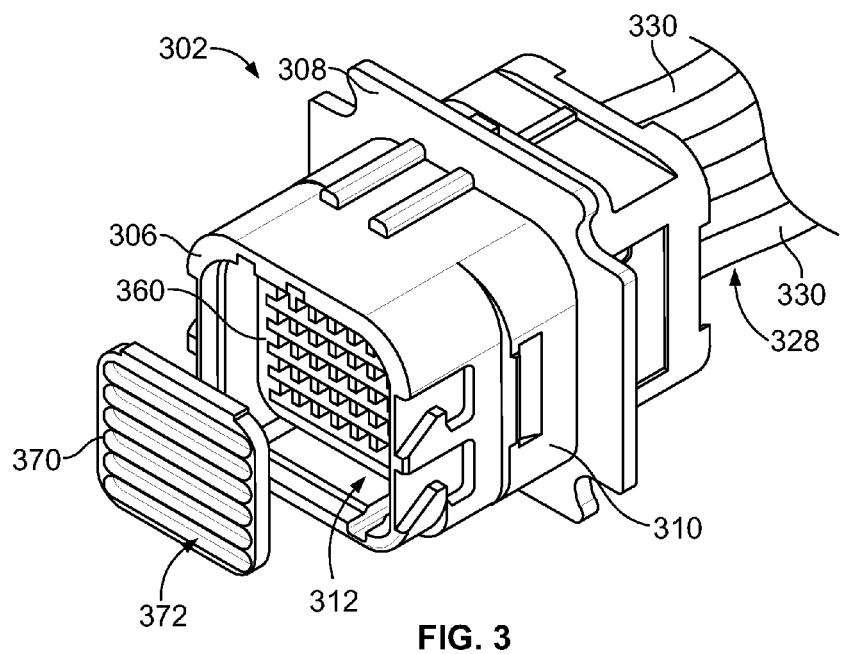
FIG. 3 is a front perspective view of an electrical connector in accordance with an exemplary embodiment.

FIG. 2 illustrates a rear perspective view of the first electrical connector 302. FIG. 3 is a front perspective view of the electrical connector 302. FIG. 4 is a front perspective view of a portion of the electrical connector 302. In an exemplary embodiment, the electrical connector 302 includes a housing 310 having a cavity 312. The housing 310 has a mating end 306 and a flange 308 for mounting the housing 310 in a device, panel or other structure. The electrical connector 302 is shown without the housing 310 in FIG. 4. In an exemplary embodiment, the housing 310 is conductive and provides electrical shielding for the components therein. The housing 310 may be a die cast housing. The housing 310 may be a plated plastic housing.

The electrical connector 302 includes a wafer stack 314, which is received in the cavity 312. The wafer stack 314 includes a plurality of electrical wafers 320 arranged parallel to each other within the cavity 312. Optionally, the wafers 320 may be sealed at the housing 310, such as at the rear of the housing 310 with a seal or gasket received in the cavity 312 or with potting or another compound in the cavity 312. Each wafer 320 includes traces 322 extending between opposite edges of the wafer 320. The traces 322 may include pads 324 at or near the first and/or second edges for electrical terminations to the traces 322.

The electrical connector 302 includes a flex harness 328 including a plurality of FPCBs 330. The FPCBs 330 are electrically connected to corresponding wafers 320. FIG. 5 illustrates an exemplary FPCB 330. The FPCB 330 includes signal traces 332 on a signal layer 333; however, the FPCB 330 may include power traces on a power layer. The FPCB 330 includes ground layers 334, such as on opposite sides of the signal layer 333. The FPCB 330 includes cover layers 335 on the outer sides of the FPCB 330. Insulating layers may be provided between the signal layer 333 and the ground layers 334 and/or between the ground layers 334 and the cover layers 335. In an exemplary embodiment, the signal layer 333 and ground layers 334 are exposed for termination to the corresponding wafer 320. For example, the FPCB may be laser ablated to expose the ground layer 334 and the signal traces 332.

FIG. 6 shows the FPCB 330 being terminated to the wafer 320. The wafer 220 includes the signal traces 322 on a signal layer 323; however, the wafer 320 may include power traces on a power layer. The wafer 320 includes ground layers 325, such as on opposite sides of the signal layer 323. The wafer 320 includes cover layers 326 on the outer sides of the wafer 320. In an exemplary embodiment, the signal layer 323 and ground layers 325 are exposed for termination of the FPCB 330 thereto. Optionally, the pads 324 of the signal traces 322 are exposed. The signal traces 322 are routed to the first edge 329 with mating pads 327 exposed at the first edge 329. During assembly, the FPCB 330 is configured to be terminated to the wafer 320. For example, the FPCB 330 may be soldered directly to the wafers 320. For example, the signal traces 332 of the FPCB 330 are aligned with the pads 324 and the exposed portion of the ground layers 334 of the FPCB 330 are aligned with the exposed portions of the ground layer 325 of the wafer 220. Solder is provided between the signal and ground layers to electrically connect the FPCB 330 to the wafer 220. Returning to FIGS. 2, 3 and 4, each FPCB 330 within the flex harness 328 is terminated to the corresponding wafer 320 in the wafer stack 314.

Figure 7:
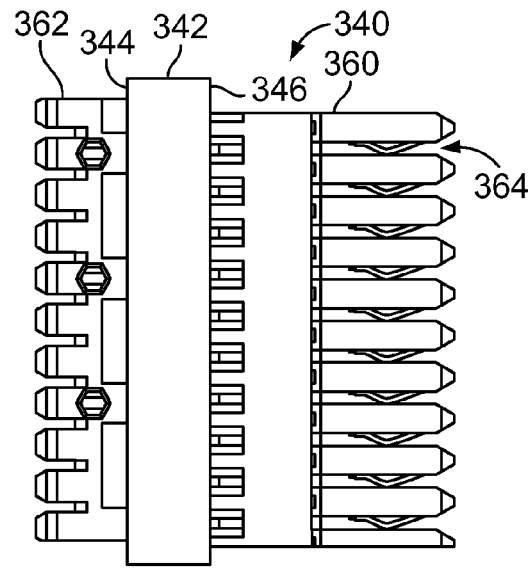
FIG. 7 illustrates an exemplary embodiment of a contact sub-assembly of the electrical connector in accordance with an exemplary embodiment.
Figure 8:
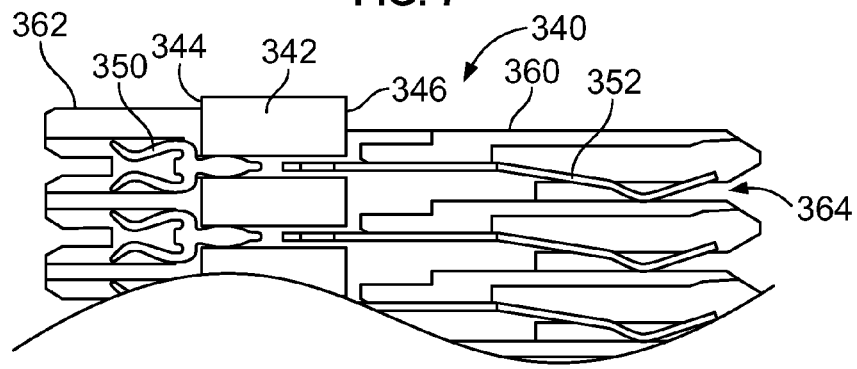
FIG. 8 is a cross-sectional view of a portion of the contact sub-assembly shown in FIG. 7.

In an exemplary embodiment, the electrical connector 302 includes a contact sub-assembly 340 provided at the front of the wafer stack 314. FIG. 7 illustrates an exemplary embodiment of the contact sub-assembly 340. FIG. 8 is a cross-sectional view of a portion of the contact sub-assembly 340. The contact sub-assembly 340 includes a RPCB 342 having a first side 344 and a second side 346. The RPCB 342 may include plated vias 348 therethrough. The contact sub-assembly 340 includes wafer contacts 350 received in corresponding vias 348 and extending from the first side 344 of the RPCB 342 and mating contacts 352 received in corresponding vias 348 and extending from the second side 346 of the RPCB 342. For example, the contacts 350, 352 may have compliant pins received in the vias 348. The mating contacts 352 may define wafer contact configured to be terminated to a wafer.

Optionally, the wafer contacts 350 are tuning-fork style contacts including a socket configured to receive the wafer 320 therein. Other types of wafer contacts 350 may be provided in alternative embodiments. The wafer contacts 350 are configured to be terminated to the mating pads 327 (shown in FIG. 6) of the wafers 320.

Optionally, the mating contacts 352 are spring beam style contacts having a deflectable spring beam configured to be mated with the electrical connector 304, such as to wafers of the electrical connector 304. The mating contacts 352 may define separable interfaces with the wafers of the electrical connector 304. The mating contacts 352 may be other types of contacts in alternative embodiments. The mating contacts 352 may be configured to be terminated to other components in alternative embodiments.

In an exemplary embodiment, the contact sub-assembly 340 includes a front housing 360 extending from the second side 346 of the RPCB 342 and a rear housing 362 extending from the first side 344 of the RPCB 342. The front housing 360 holds the mating contacts 352. For example, the front housing 360 may include a plurality of contact channels that hold corresponding mating contacts 352. The front housing 360 includes a plurality of slots 364 configured to receive wafers of the second electrical connector 304. The mating contacts 352 are configured to be electrically connected to the wafers received in the slots 364 at separable interfaces of the mating contacts 352. The rear housing 362 holds the wafer contacts 350. The rear housing 362 has a plurality of slots 366. Each slot 366 is configured to receive a corresponding wafer 320 of the wafer stack 314. The wafer contacts 350 may be terminated to such wafers 320 within the slots 366.

In an exemplary embodiment, with reference to FIG. 3, the electrical connector 302 includes a spacer 370 at a front end of the contact sub-assembly 340. The spacer 370 is configured to be received in the cavity 312 of the housing 310. The spacer 370 may be coupled to the front end of the front housing 360. The spacer 370 provides a mating interface for the second electrical connector 304. The second electrical connector 304 may be sealed against the spacer 370. The spacer 370 includes sealing surfaces for sealing engagement with the second electrical connector 304. In an exemplary embodiment, the spacer 370 includes a plurality of channels 372 that are configured to receive wafers of the electrical connector 304. The channels 372 allow the wafers to pass through to corresponding slots 364 of the front housing 360 for mating with the mating contacts 352.

Figure 9:
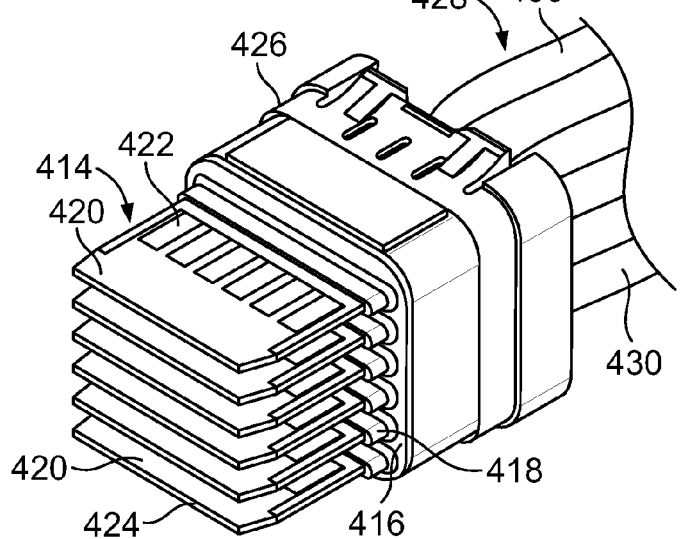
FIG. 9 illustrates a portion of an electrical connector of the connector system in accordance with an exemplary embodiment.

Returning to FIG. 2, and with additional reference to FIG. 9, which illustrates a portion of the electrical connector 304, the electrical connector 304 is configured to be mated with the electrical connector 302. The electrical connector 304 includes a housing 410 (FIG. 2) having a cavity 412. In an exemplary embodiment, the housing 410 is conductive and provides electrical shielding for the components therein. The housing 410 may be a die cast housing. A wafer stack 414 is received in the cavity 412. The wafer stack 414 includes a plurality of electrical wafers 420 arranged parallel to each other within the cavity 412.

Optionally, the wafers 420 may be sealed at the housing 410. For example, the electrical connector 304 may include a gasket or seal 416 coupled to the wafer stack 414. The seal 416 seals against each of the wafers 420. The seal 416 includes extensions 418 surrounding each of the wafers 420. The extensions 418 are configured to be received in corresponding channels 372 (FIG. 3) of the spacer 370 (FIG. 3). The seal 416 seals against the spacer 370. Optionally, the spacer 370 may be planar or flat at the front to provide a good sealing surface for the seal 416.

Each wafer 420 includes signal traces 422 on a signal layer of the wafer 420. The signal traces 422 may be exposed at or near one or both edges 424 of the wafer. The traces 422 may include pads for electrical terminations to the traces 422. The wafer 420 includes one or more ground layers which may be exposed at predetermined locations for electrical termination.

In an exemplary embodiment, the electrical connector 304 includes a wafer holder 426 configured to hold each of the wafers 420 of the wafer stack 414. For example, the wafer holder 426 may hold the wafers 420 at predetermined spacing. The wafer holder 426 is configured to be received in the housing 410. For example, the wafer holder 426 may be sized and shaped to fit in the cavity 412. The wafer holder 426 may be manufactured from a dielectric material, such as a plastic material. The seal 416 may seal against the wafer holder 426. For example, the seal 416 may seal at the locations where the wafers 420 extend from the wafer holder 426.

The electrical connector 304 includes a flex harness 428 having a plurality of FPCBs 430. The FPCBs 430 may be similar to the FPCBs 330 (FIG. 6). The FPCBs 430 may be terminated to the wafers 420 in a similar manner as described above. The traces of the FPCBs 430 are electrically connected to corresponding traces 422 of the wafers 420.

During assembly, the electrical connector 304 is coupled to the electrical connector 302. The wafers 420 are loaded into the electrical connector 302 and mated to the contact sub-assembly 340. The mating contacts 352 are terminated to the pads of the traces 422 of the wafers 420. The FPCBs 430 are electrically connected to the FPCBs 330 via the contact sub-assembly 340.

Figure 10:
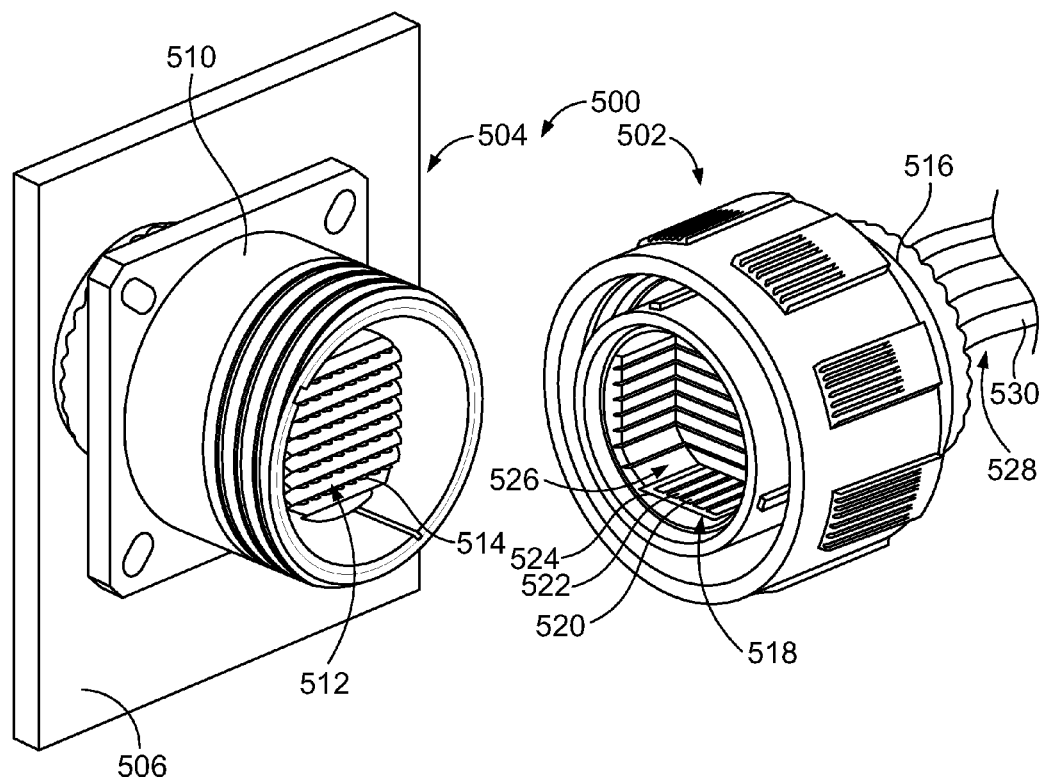
FIG. 10 illustrates a connector system formed in accordance with an exemplary embodiment.
Figure 11:
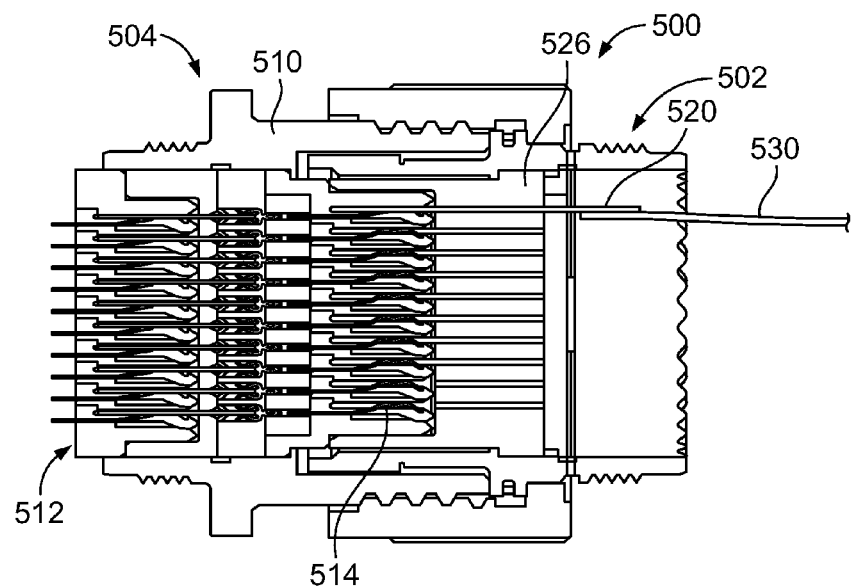
FIG. 11 is a cross-sectional view of the connector system shown in FIG. 10.

FIG. 10 illustrates a connector system 500 formed in accordance with an exemplary embodiment. FIG. 11 is a cross-sectional view of the connector system 500. The connector system 500 includes a first electrical connector 502 and a second electrical connector 504 configured to be electrically connected to the first electrical connector 502. In an exemplary embodiment, the electrical connectors 502, 504 are modular circular connectors for use in aerospace or military applications and may have size, shape and mating interface requirements corresponding to D38999 standard connectors, such as those commercially available from TE Connectivity.

The first electrical connector 502 is configured to be terminated to a circuit board 506. The first electrical connector 502 includes a housing 510 holding a contact sub-assembly 512. The contact sub-assembly 512 includes a plurality of contacts 514 configured to be mated to the electrical connector 504. The contacts 514 are electrically connected to the circuit board 506, such as via other contacts and an intermediate RPCB.

The second electrical connector 504 includes a housing 516 having a threaded coupling nut configured to be threadably coupled to the housing 510. The second electrical connector 504 includes a wafer stack 518 received in the housing 516. The wafer stack 518 includes a plurality of electrical wafers 520 (only one illustrated in FIG. 10) arranged parallel to each other within the cavity of the housing 516. Each wafer 520 includes signal traces 522 on a signal layer of the wafer 520. The signal traces 522 may be exposed at or near one or both edges 524 of the wafer. The traces 522 may include pads for electrical terminations to the traces 522. The wafer 520 includes one or more ground layers which may be exposed at predetermined locations for electrical termination.

In an exemplary embodiment, the electrical connector 504 includes a wafer holder 526 configured to hold each of the wafers 520 of the wafer stack 518. For example, the wafer holder 526 may hold the wafers 520 at predetermined spacing. The wafer holder 526 is configured to be received in the housing 516. For example, the wafer holder 526 may be sized and shaped to fit in the cavity of the housing 516.

The electrical connector 504 includes a flex harness 528 having a plurality of FPCBs 530. The FPCBs 530 may be similar to the FPCBs 330 (FIG. 6). The FPCBs 530 may be terminated to the wafers 520 in a similar manner as described above. The traces of the FPCBs 530 are electrically connected to corresponding traces 522 of the wafers 520.

During assembly, the electrical connector 504 is coupled to the electrical connector 502. The wafers 520 are loaded into the electrical connector 502 and mated to the contact sub-assembly 512. The mating contacts 514 are terminated to the pads of the traces 522 of the wafers 520. The FPCBs 530 are electrically connected to the circuit board 506 via the contact sub-assembly 512 and the wafers 520.

Figure 12:
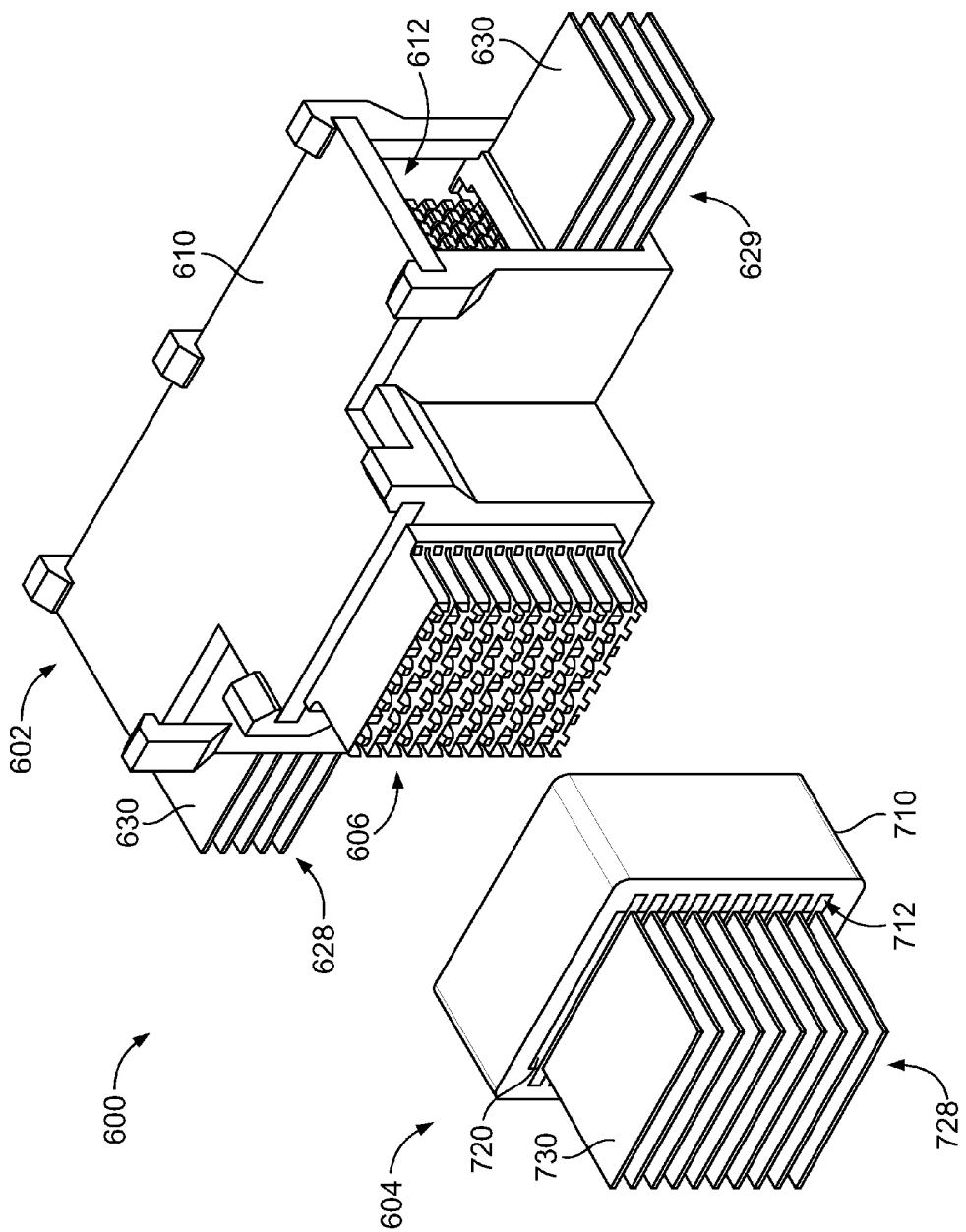
FIG. 12 illustrates a connector system formed in accordance with an exemplary embodiment.
Figure 13:
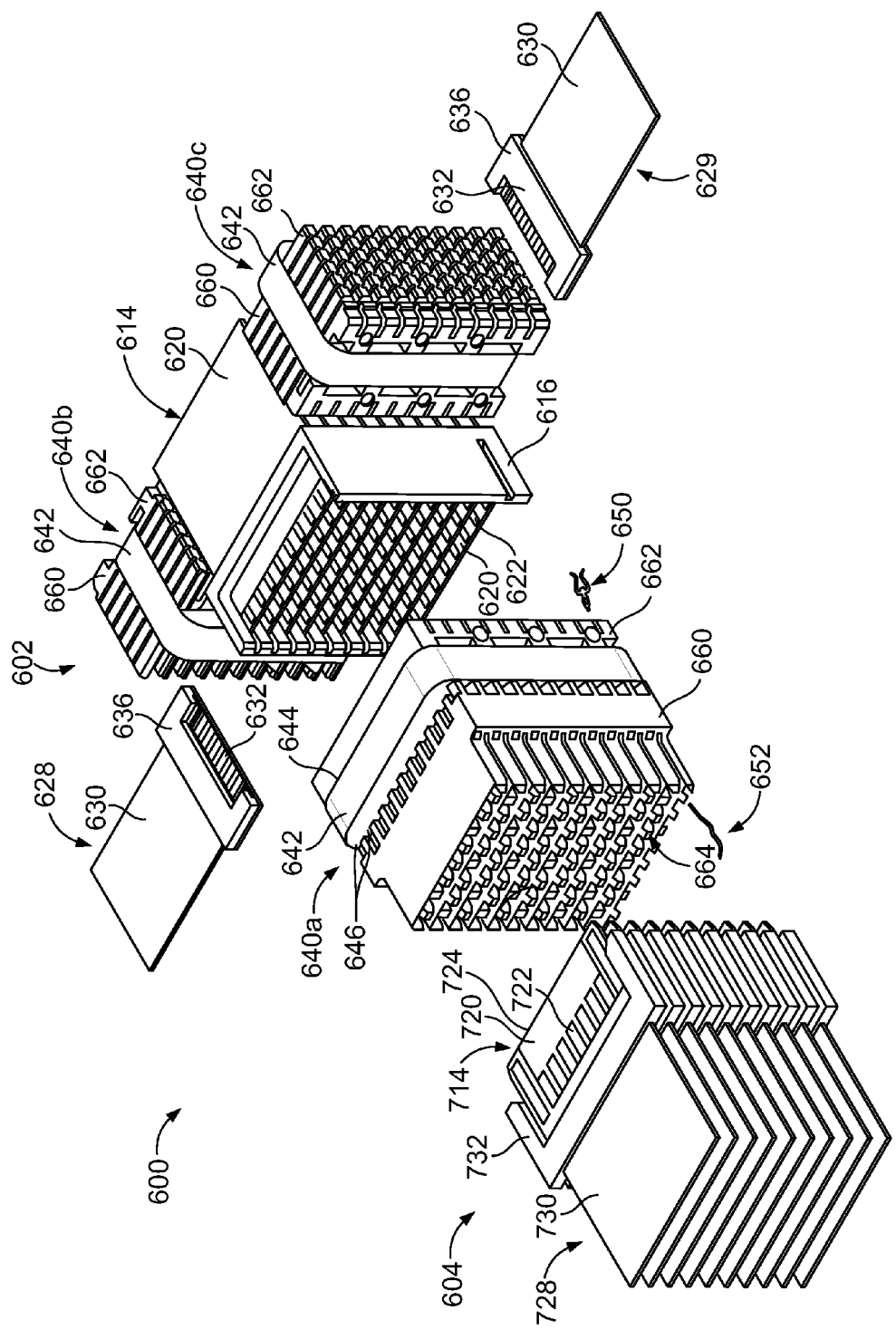
FIG. 13 is an exploded view of a portion of the connector system shown in FIG. 12.

FIG. 12 illustrates a connector system 600 formed in accordance with an exemplary embodiment. FIG. 13 is an exploded view of a portion of the connector system. The connector system 600 includes a first electrical connector 602 and a second electrical connector 604 configured to be electrically connected to the first electrical connector 602. In an exemplary embodiment, the electrical connector 602 includes a housing 610 (FIG. 12) having a cavity 612. The electrical connector 602 is shown without the housing 610 in FIG. 13. The housing 610 has a mating end 606 and the second electrical connector 604 is configured to be coupled to the housing 610 at the mating end 606. In an exemplary embodiment, the housing 610 is manufactured from a dielectric material, such as a plastic material, however the housing 610 may be conductive in alternative embodiments to provide electrical shielding for the components therein.

The electrical connector 602 includes a wafer stack 614 (FIG. 13), which is received in the cavity 612. The electrical connector 602 includes a wafer holder 616 that holds the wafer stack 614. Optionally, the wafer holder 616 may define a portion of the housing 610. In other various embodiments, the electrical connector 602 may include only the wafer holder 616 as the housing and not include the outer housing shown in FIG. 12.

Figure 14:
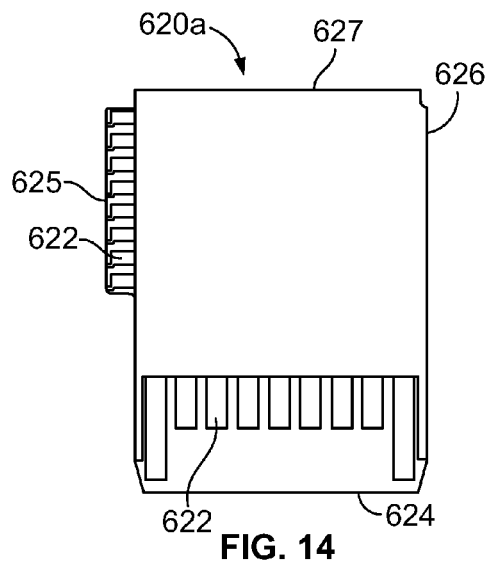
FIGS. 14-17 show wafers in accordance with exemplary embodiments.
Figure 15:
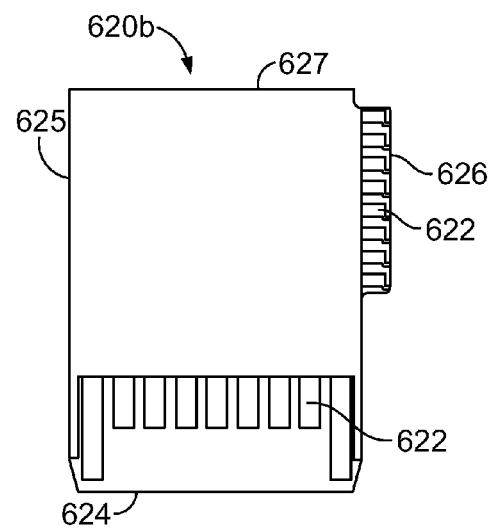
Figure 16:
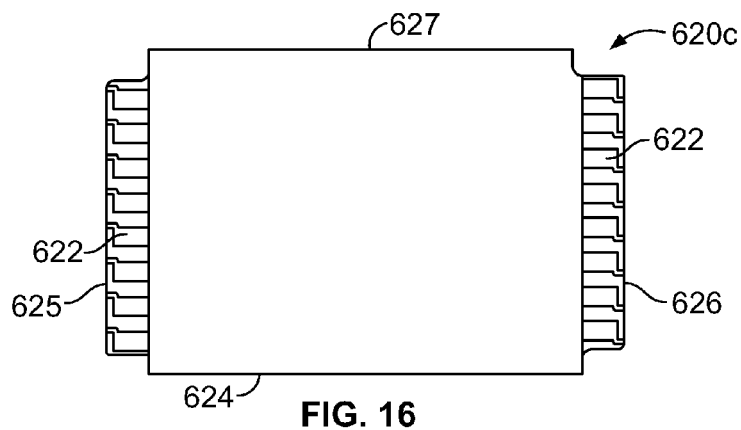
Figure 17:
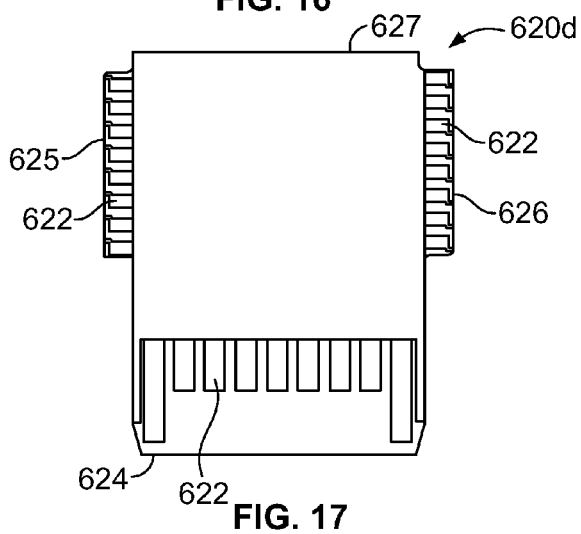

The wafer stack 614 includes a plurality of electrical wafers 620 arranged parallel to each other within the cavity 612. The wafers may be signal wafers, power wafers or hybrid wafers. Examples of wafers are illustrated in FIGS. 14-17. FIG. 14 shows a left-version right angle wafer 620a. FIG. 15 shows a right-version right angle wafer 620b. FIG. 16 shows a straight pass through wafer 620c. FIG. 17 shows a T-version right angle wafer 620d. Each wafer 620 includes traces 622, which may be signal traces, power traces or ground traces. The wafer 620 has a first edge 624, second and third edges 625, 626 and a fourth edge 627 opposite the first edge 624. The traces 622 may include pads at or near the edges for electrical terminations to the traces 622. The various types of wafers 620 have different arrangements of pads and different routing of the traces 622. For example, the left-version right angle wafer 620a (FIG. 14) has pads at the first edge 624 and the second edge 625; the right-version right angle wafer 620b (FIG. 15) has pads at the first edge 624 and the third edge 626; the straight pass through wafer 620c has pads at the second and third edges 625, 626; and the T-version right angle wafer 620d has pads at the first edge 624 as well as both the second and third edges 625, 626. Other embodiments may provide pads at the fourth edge 627. Returning to FIG. 13, any of the different types of wafers 620 may be provided in any arrangement depending on the signal or power routing requirements for the electrical connector 602. The first edges 624 of the wafers 620 are held by the wafer holder 616. The wafer holder 616 and pads at the first edges 624 define a connector interface configured to be connected to a contact sub-assembly 640 (also referred to as a front contact sub-assembly 640a, which is in contrast to side contact sub-assemblies 640b, 640c configured to be coupled to the second and third edges 625, 626, respectively)

The electrical connector 602 includes first and second flex harnesses 628, 629 coupled to opposite sides of the electrical connector 602; however a single flex harness 628 or 629 may be provided in alternative embodiments. Each flex harness 628, 629 include a plurality of FPCBs 630 (only one FPCB 630 illustrated per flex harness in FIG. 13). The FPCBs 630 are electrically connected to corresponding wafers 620.

Figure 18:
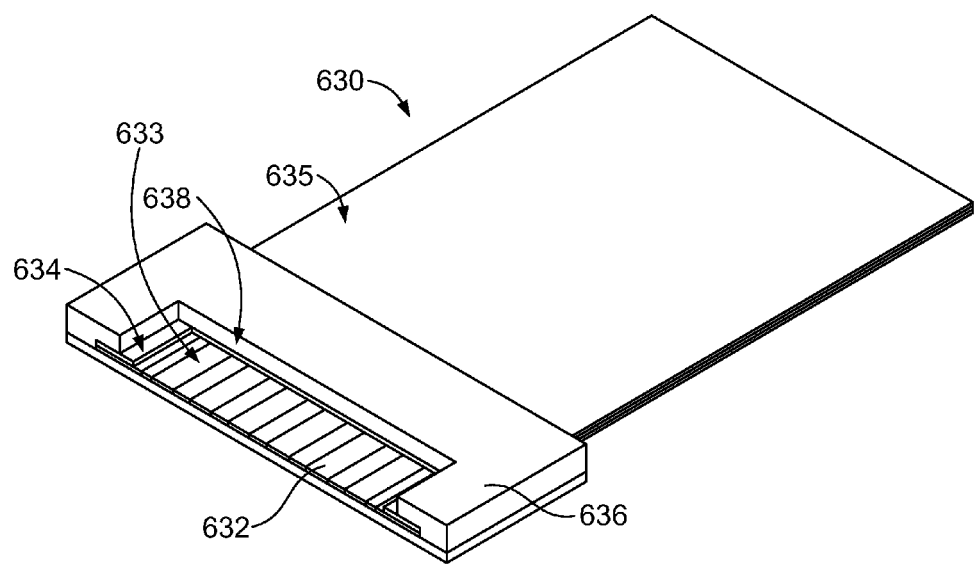
FIG. 18 illustrates a FPCB in accordance with an exemplary embodiment.

FIG. 18 illustrates an exemplary FPCB 630. The FPCB 630 includes signal traces 632 on a signal layer 633; however, the FPCB 630 may include power traces on a power layer. The FPCB 630 includes one or more ground layers 634, such as on opposite sides of the signal layer 633. The FPCB 630 includes cover layers 635 on the outer sides of the FPCB 630. Insulating layers may be provided between the signal layer 633 and the ground layers 634 and/or between the ground layers 634 and the cover layers 635. In an exemplary embodiment, the signal layer 633 and ground layers 634 are exposed for termination to the corresponding wafer 620. For example, the FPCB may be laser ablated to expose the ground layer 634 and the signal traces 632.

In an exemplary embodiment, a flex circuit stiffener 636 is provided at an end of the FPCB 630. The stiffener 636 includes a window 638 providing access to the exposed signal and ground layers 633, 634. The traces 632 are exposed in the window 638 for electrical connection to another component. The stiffener 636 may be manufactured from a plastic material, from a metal material, or from another material. The stiffener 636 may include securing features for securing the FPCB to the wafer 620 and/or corresponding side contact sub-assembly 640 (FIG. 13). The stiffener 636 may include guide features to guide mating and/or positioning with the wafer 620 and/or the contact sub-assembly 640.

Figure 19:
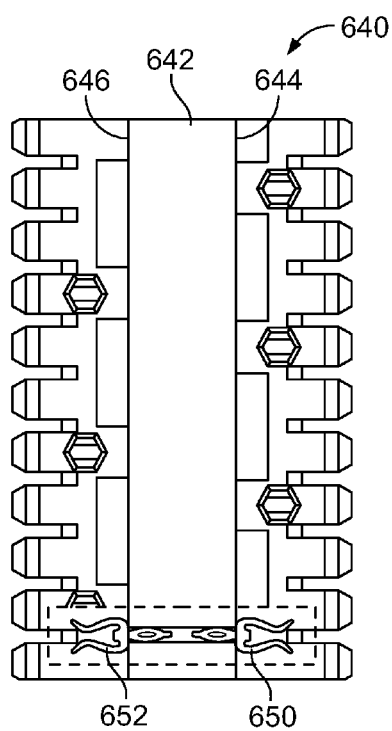
FIG. 19 illustrates a contact sub-assembly in accordance with an exemplary embodiment.
Figure 20:
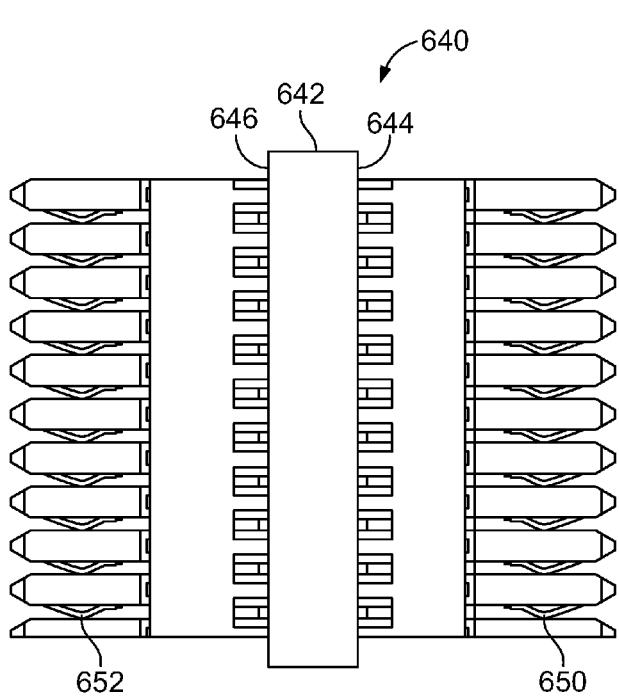
FIG. 20 illustrates a contact sub-assembly in accordance with an exemplary embodiment.

Returning to FIG. 13, the contact sub-assemblies 640 are provided at the front of the wafer stack 614 (e.g., the front contact sub-assembly 640a), at the first side of the wafer stack 614 (e.g., the side contact sub-assembly 640b), and at the second side of the wafer stack 614 (e.g., the side contact sub-assembly 640c). The front contact sub-assembly 640a may be similar to the contact sub-assembly shown in FIG. 7. Other versions of contact sub-assemblies 640 are illustrated in FIGS. 19 and 20. The contact sub-assemblies 640 include similar features; however the various embodiments of the contact sub-assemblies 640 may include different types of contacts at the various interfaces. Generally, each contact sub-assembly 640 includes a RPCB 642 having a first side 644 and a second side 646. The RPCB 642 may include plated vias therethrough. The contact sub-assembly 640 includes wafer contacts 650 (one shown exploded, similar to the wafer contact 350 shown in FIG. 8) extending from the first side 644 of the RPCB 642 and mating contacts 652 (one shown exploded, similar to the mating contact 352 shown in FIG. 8) extending from the second side 646 of the RPCB 642. For example, the contacts 650, 652 may have compliant pins received in the vias. Different types of contacts are illustrated in the embodiments shown in FIGS. 7, 19 and 20. For example, FIG. 7 illustrates an embodiment having tuning-fork style contacts as the wafer contacts and spring beam style contacts as the mating contacts. FIG. 19 illustrates an embodiment having tuning-fork style contacts as both the wafer contacts 650 and the mating contacts 652. FIG. 20 illustrates an embodiment having spring beam style contacts as both the wafer contacts 650 and the mating contacts 652. The wafer contacts 650 are configured for mating with the wafers 620 and the mating contacts 652 are configured for mating with the electrical connector 604 or the FPCBs 630.

Returning to FIG. 13, in an exemplary embodiment, the contact sub-assembly 640 includes a front housing 660 extending from the second side 646 of the RPCB 642 and a rear housing 662 extending from the first side 644 of the RPCB 642. The front housing 660 holds the mating contacts 652. For example, the front housing 660 may include a plurality of contact channels that hold corresponding mating contacts 652. The front housing 660 of the front contact sub-assembly 640a includes a plurality of slots 664 configured to receive wafers of the second electrical connector 604. The mating contacts 652 are configured to be electrically connected to the wafers received in the slots 664 at separable interfaces of the mating contacts 652. The front housing 660 of the side contact sub-assembly 640b or 640c includes a plurality of slots 664 configured to receive the stiffeners 636 and FPCBs 630. The mating contacts 652 are configured to be electrically connected to the traces 632 on the FPCBs 630 received in the slots 664. The rear housing 662 holds the wafer contacts 650. The rear housing 662 has a plurality of slots 666. Each slot 666 is configured to receive a corresponding wafer 620 of the wafer stack 614. The wafer contacts 650 may be terminated to such wafers 620 within the slots 666.

The electrical connector 604 is configured to be mated with the electrical connector 602. The electrical connector 604 includes a housing 710 (FIG. 12) having a cavity 712. A wafer stack 714 is received in the cavity 712. The wafer stack 714 includes a plurality of electrical wafers 720 arranged parallel to each other within the cavity 712.

Each wafer 720 includes signal traces 722 on a signal layer of the wafer 720. The signal traces 722 may be exposed at or near one or both edges 724 of the wafer. The traces 722 may include pads for electrical terminations to the traces 722. The wafer 720 includes one or more ground layers which may be exposed at predetermined locations for electrical termination.

The electrical connector 604 includes a flex harness 728 having a plurality of FPCBs 730. The FPCBs 730 may be similar to the FPCBs 630 (FIG. 18). The FPCBs 730 may be terminated directly to the wafers 720, such as by soldering the exposed traces and ground layers to corresponding traces and ground layers of the wafer 720. A stiffener 732 may be used to hold the corresponding FPCB 730 for termination to the wafer 720. The stiffeners 732 may be held in the housing 710, such as using securing features, guide features, and the like.

During assembly, the wafers 720 and FPCBs 730 are loaded into the housing 710. Similarly, the wafers 620 and contact sub-assemblies 640 are loaded into the housing 610. The electrical connector 604 is coupled to the electrical connector 602 by plugging the electrical connector 604 into the housing 610. The wafers 720 are loaded into the front housing 660 of the front contact sub-assembly 640a at a separable interface. The mating contacts 652, which are separable contacts, are terminated to the pads of the traces 722 of the wafers 720. The FPCBs 730 are electrically connected to the FPCBs 630 via the contact sub-assemblies 640 and wafers 620.

Figure 21:
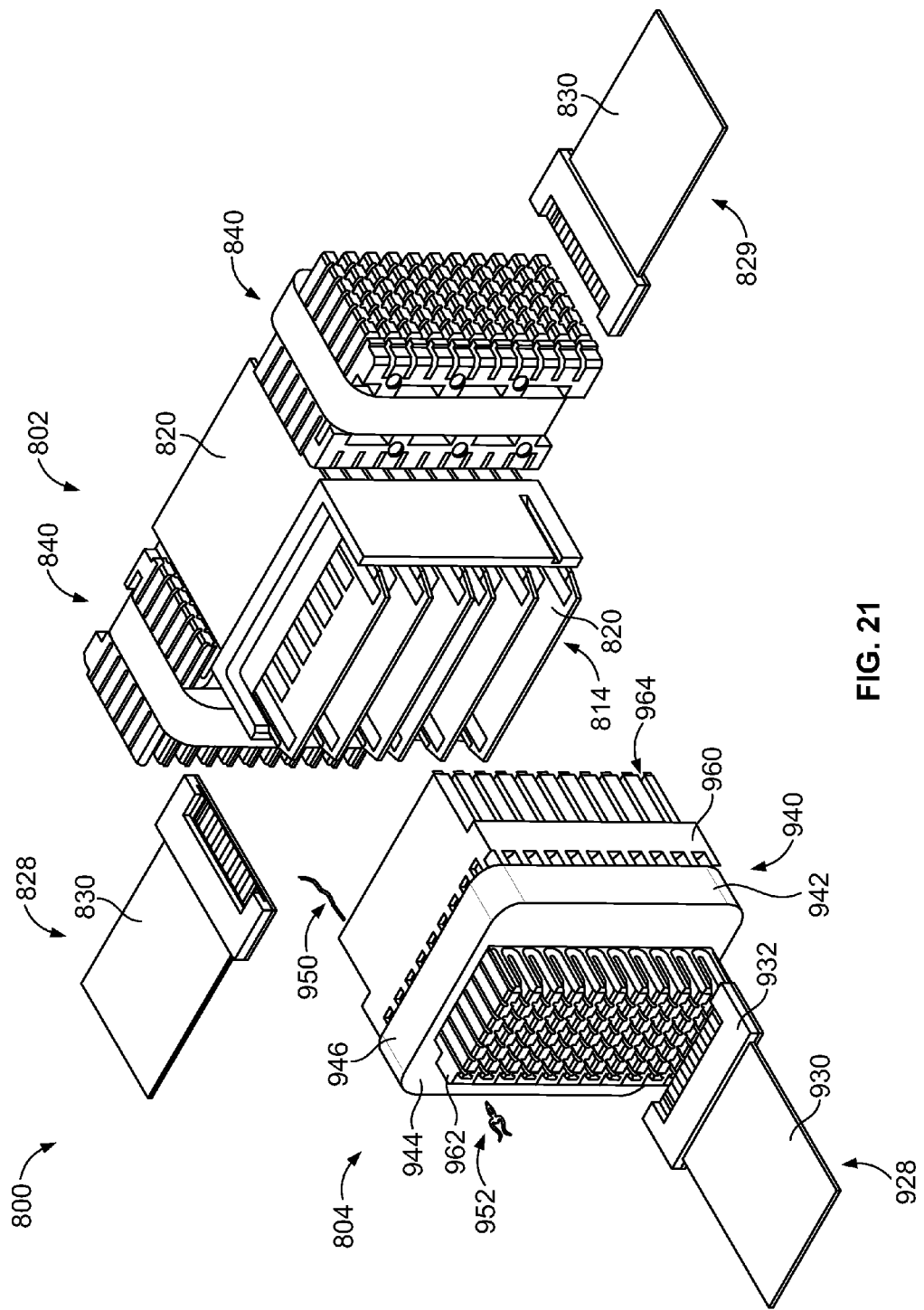
FIG. 21 illustrates a connector system formed in accordance with an exemplary embodiment.

FIG. 21 illustrates a connector system 800 formed in accordance with an exemplary embodiment. The connector system 800 is similar to the connector system 600 (FIG. 13); however, in the embodiment illustrated in FIG. 21, the front connector sub-assembly 640a (FIG. 13) forms part of the second electrical connector. The connector system 800 includes a first electrical connector 802 and a second electrical connector 804 configured to be electrically connected to the first electrical connector 802.

The electrical connector 802 includes a wafer stack 814 having a plurality of electrical wafers 820. The electrical connector 802 includes first and second flex harnesses 828, 829 similar to the flex harnesses 628, 629 (shown in FIG. 13) and first and second side contact sub-assemblies 840 similar to the side contact sub-assemblies 640b, 640c (shown in FIG. 13). Each flex harness 828, 829 include a plurality of FPCBs 830. The FPCBs 830 are electrically connected to corresponding wafers 820 via the contact sub-assemblies 840.

The electrical connector 804 is configured to be mated with the electrical connector 802. The electrical connector 804 includes a flex harness 928 having a plurality of FPCBs 930. The FPCBs 930 may be similar to the FPCBs 830. For example, the FPCBs 930 may include stiffeners 932 at the end of the FPCB to support the traces for mating.

The electrical connector 804 includes a contact sub-assembly 940 configured for mating to the wafer stack 814 of the electrical connector 802. The contact sub-assembly 940 includes a RPCB 942 having a first side 944 and a second side 946. The RPCB 942 may include plated vias therethrough. The contact sub-assembly 940 includes contacts 950 extending from the first side 944 of the RPCB 942 and mating contacts 952 extending from the second side 946 of the RPCB 942. For example, the contacts 950, 952 may have compliant pins received in the vias. The contact sub-assembly 940 includes a front housing 960 extending from the second side 946 of the RPCB 942 and a rear housing 962 extending from the first side 944 of the RPCB 942. The front housing 960 holds the mating contacts 952. The front housing 960 includes a plurality of slots 964 configured to receive the wafers 820 of the electrical connector 802. The mating contacts 952 are configured to be electrically connected to the wafers 820 at separable interfaces of the mating contacts 952. The rear housing 962 holds the contacts 950. The rear housing 962 has a plurality of slots 966. Each slot 966 is configured to receive a corresponding FPCB 830 and corresponding stiffener 932.

Figure 22:
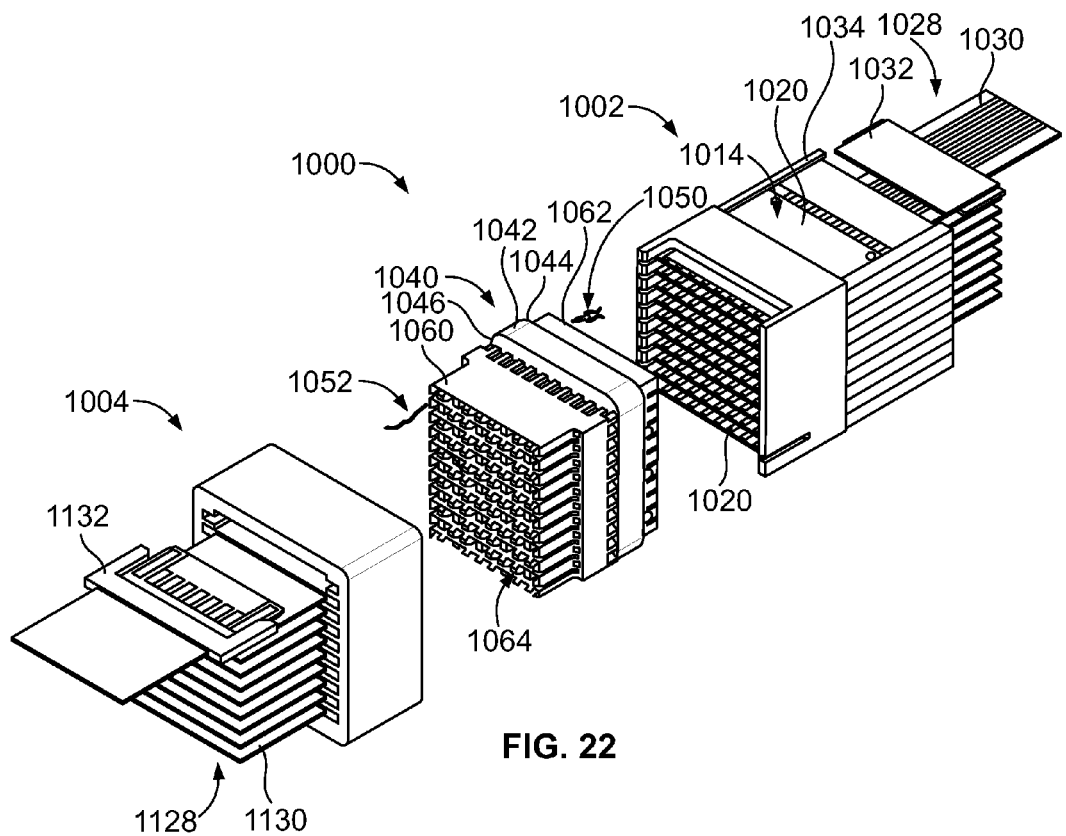
FIG. 22 illustrates a connector system formed in accordance with an exemplary embodiment.

FIG. 22 illustrates a connector system 1000 formed in accordance with an exemplary embodiment. The connector system 1000 is similar to the connector system 600 (FIG. 13); however, in the embodiment illustrated in FIG. 22, the connector system 100 is a straight pass through connector system rather than a right angle connector system. The connector system 1000 includes a first electrical connector 1002 and a second electrical connector 1004 configured to be electrically connected to the first electrical connector 1002.

The electrical connector 1002 includes a wafer stack 1014 having a plurality of electrical wafers 1020. The electrical connector 1002 includes a flex harness 1028 similar to the flex harness 628 (shown in FIG. 13) and a front contact sub-assembly 1040 similar to the front contact sub-assembly 640a (shown in FIG. 13). The flex harness 1028 includes a plurality of FPCBs 1030. The FPCBs 1030 are electrically connected to corresponding wafers 1020. For example, the FPCBs 1030 may be directly terminated to the wafers 1020, such as by soldering the FPCBs 1030 to the wafers 1020. The FPCBs 1030 may include stiffeners 1032 to support the ends of the FPCBs 1030 for mounting, positioning and soldering the FPCBs 1030 to the wafers 1020. The electrical connector 1002 may include holders 1034 that hold the stiffener 1032 in place relative to the wafer 1020, such as for soldering or for strain relief.

The electrical connector 1002 includes a contact sub-assembly 1040 configured for mating to the wafer stack 1014 of the electrical connector 1002. The contact sub-assembly 1040 includes a RPCB 1042 having a first side 1044 and a second side 1046. The RPCB 1042 may include plated vias therethrough. The contact sub-assembly 1040 includes contacts 1050 extending from the first side 1044 of the RPCB 1042 and mating contacts 1052 extending from the second side 1046 of the RPCB 1042. For example, the contacts 1050, 1052 may have compliant pins received in the vias. The contact sub-assembly 1040 includes a front housing 1060 extending from the second side 1046 of the RPCB 1042 and a rear housing 1062 extending from the first side 1044 of the RPCB 1042. The front housing 1060 holds the mating contacts 1052. The front housing 1060 includes a plurality of slots 1064 configured to receive the wafers 1020 of the electrical connector 1002. The mating contacts 1052 are configured to be electrically connected to wafers of the second electrical connector 1004 at separable interfaces of the mating contacts 1052. The rear housing 1062 holds the wafer contacts 1050. The rear housing 1062 has a plurality of slots 1066. Each slot 1066 is configured to receive a corresponding wafer 1020 to electrically connect the wafer contacts 1050 to the wafers 1020.

The electrical connector 1004 is configured to be mated with the electrical connector 1002. The electrical connector 1004 includes a flex harness 1128 having a plurality of FPCBs 1130. The FPCBs 1130 may be similar to the FPCBs 1030. For example, the FPCBs 1130 may include stiffeners 1132 at the ends of the FPCBs 1130 to support the traces for mating, soldering and the like.

Figure 23:
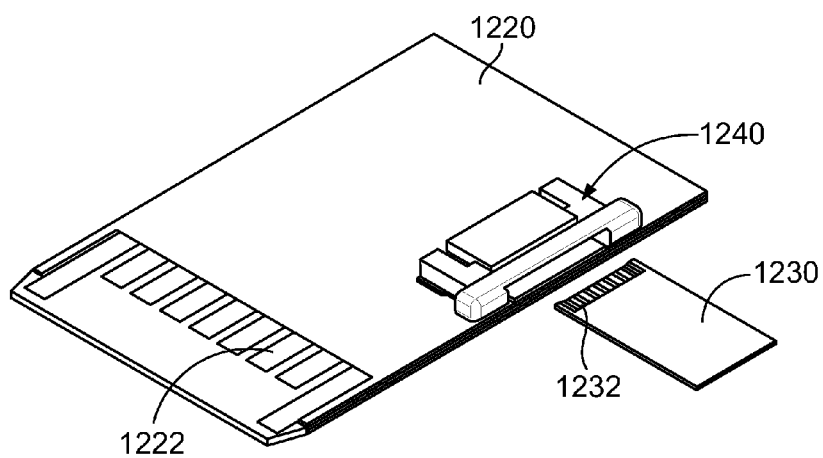
FIG. 23 is a perspective view of a wafer and a FPCB in accordance with an exemplary embodiment.

FIG. 23 is a perspective view of a wafer 1220 and a FPCB 1230 poised for termination to the wafer 1220. A contact sub-assembly 1240 is mounted to the wafer 1220. For example, the contact sub-assembly 1240 may include a plurality of contacts terminated to corresponding traces 1222 of the wafer 1220 (e.g., soldered, press-fit, or otherwise electrically connected). The FPCB includes exposed traces 1232 that may be electrically connected to the contacts of the contact sub-assembly 1240. In other various embodiments, the contact sub-assembly may be used to hold the FPCB 1230 in position such that the FPCB 1230 may be terminated directly to the traces 1222 of the wafer 1220. For example, the FPCB 1230 may be soldered to the wafer 1220. The contact sub-assembly 1240 may position or guide the FPCB 1230 and/or provide strain relief after soldered.

Figure 24:
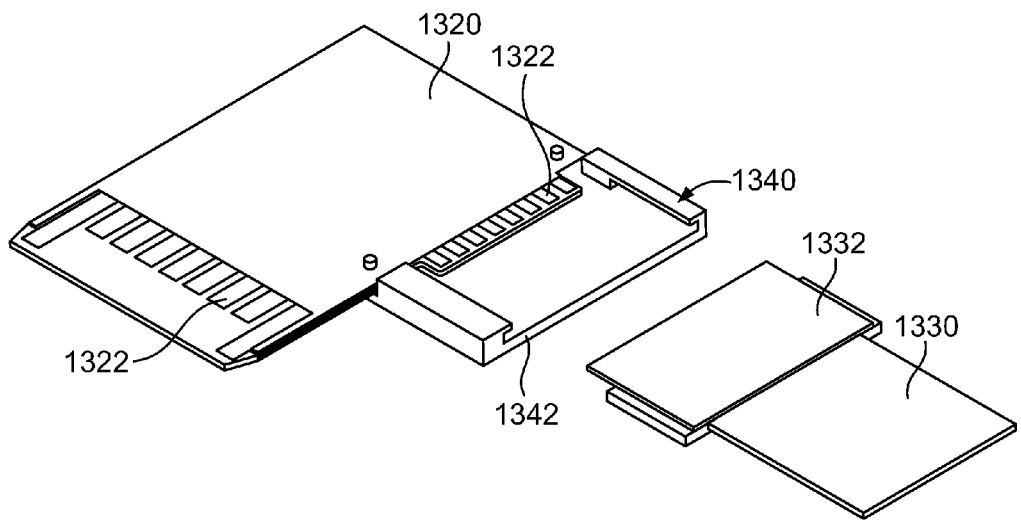
FIG. 24 is a perspective view of a wafer and a FPCB in accordance with an exemplary embodiment.

FIG. 24 is a perspective view of a wafer 1320 and a FPCB 1330 poised for termination to the wafer 1320. A contact sub-assembly 1340 is mounted to the wafer 1320. For example, the contact sub-assembly 1340 may include a housing 1342 mounted to the wafer 1320 having guide features to guide mating of the FPCB 1330 to the wafer 1320. The FPCB 1330 includes a stiffener 1332 that supports the end of the FPCB 1330. The stiffener 1332 may be loaded into the housing 1342 to position the FPCB 1330 such that the FPCB 1330 may be terminated directly to corresponding traces 1322 of the wafer 1320. For example, the FPCB 1330 may be soldered to the wafer 1320.

Figure 25:
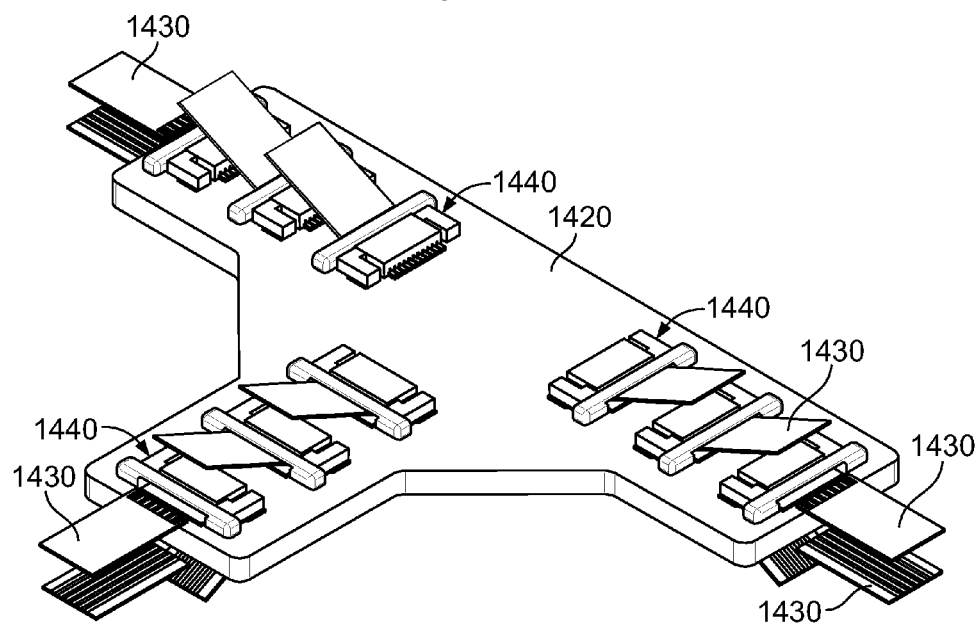
FIG. 25 is a perspective view of a wafer and a plurality of FPCBs in accordance with an exemplary embodiment.

FIG. 25 is a perspective view of a wafer 1420 having a plurality of FPCBs 1430 terminated thereto. In the illustrated embodiment, the wafer 1420 allows right angle connections and straight pass through connections. A plurality of contact sub-assemblies 1440 are mounted to the wafer 1420. The FPCBs 1430 may be terminated to the contact sub-assemblies 1440 or alternatively, directly to the wafer 1420 with the aide of the contact sub-assemblies 1440.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f), unless and until such claim limitations expressly use the phrase "means for" followed by a statement of function void of further structure.

What is claimed is:

1. An electrical connector comprising:
    a housing having a cavity;
    a wafer stack received in the cavity, the wafer stack comprising a plurality of electrical wafers, the electrical wafers being discrete from each other and stacked such that the electrical wafers are arranged parallel to each other within the cavity with spaces between the stacked electrical wafers, each wafer including a first edge and a second edge, each wafer including at least one trace between the first and second edges; and
    a flex harness comprising a plurality of flexible printed circuit boards (FPCBs), the FPCBs being discrete from each other and electrically connected to corresponding wafers.

2. The electrical connector of claim 1, wherein the FPCBs are directly terminated to the corresponding wafers.

3. The electrical connector of claim 1, wherein the FPCBs are soldered to the corresponding wafers.

4. The electrical connector of claim 1, further comprising a contact sub-assembly terminated to at least one of the wafers, the flex harness being terminated to the contact sub-assembly.

5. The electrical connector of claim 1, further comprising a contact sub-assembly terminated to each of the wafers of the wafer stack, the contact sub-assembly comprising a plurality of contacts terminated to corresponding traces of the wafer.

6. The electrical connector of claim 5, wherein the FPCBs are terminated to the corresponding wafers at or near the first edge, the contact sub-assembly being terminated to the wafers at or near the second edge.

7. The electrical connector of claim 6, wherein the wafers include a third edge, at least one of a second contact sub-assembly or a second flex harness being terminated to the wafers at or near the third edge.

8. The electrical connector of claim 1, further comprising a second flex harness comprising a plurality of FPCBs, the FPCBs of the second flex harness being electrically connected to the FPCBs of the first flex harness via the wafers.

9. The electrical connector of claim 1, wherein each of the wafers are sealed at seal interfaces.

10. The electrical connector of claim 1, wherein the wafers are right-angled wafers with the first edge perpendicular to the second edge.

11. The electrical connector of claim 1, wherein the first edges of each of the wafers define separable interfaces, the FPCBs being terminated to the wafers at or near the second edge.

12. The electrical connector of claim 1, wherein each of the wafers include at least one signal layer and at least one ground layer, the signal and ground layers being exposed along a mating surface of the wafer, each of the FPCBs having a signal layer and a ground layer, the signal and ground layers of the FPCB being exposed along a mating interface of the FPCB, the signal layer of the FPCB having traces being soldered to corresponding traces of the signal layer of the wafer, the ground layer of the FPCB being soldered to the ground layer of the wafer.

13. An electrical connector comprising:
a housing having a cavity;
a wafer stack received in the cavity, the wafer stack comprising a plurality of electrical wafers arranged parallel to each other within the cavity, each wafer including a first edge and a second edge, each wafer including traces between the first and second edges, each trace having a first pad and a second pad;
a contact sub-assembly terminated to the wafer stack, the contact sub-assembly comprising a rigid printed circuit board (RPCB) having a first side and a second side, the contact sub-assembly comprising wafer contacts extending from the first side of the RPCB and mating contacts extending from the second side of the RPCB, the contact sub-assembly being terminated to the wafer stack such that the wafer contacts are terminated to the first pads of corresponding traces of the wafers of the wafer stack; and
a flex harness comprising a plurality of flexible printed circuit boards (FPCBs), the FPCBs having traces, the FPCBs being terminated to the contact sub-assembly such that the traces are electrically connected to the second pads of corresponding traces of the wafers of the wafer stack.

14. The electrical connector of claim 13, wherein the contact sub-assembly further comprises a front housing extending from the second side of the RPCB and a rear housing extending from the first side of the RPCB, the front housing holding the mating contacts, the rear housing holding the wafer contacts, the rear housing having a plurality of slots, each slot receiving a corresponding wafer of the wafer stack.

15. The electrical connector of claim 14, wherein the front housing comprises a plurality of slots configured to receive wafers configured to be electrically connected to corresponding mating contacts at separable interfaces of the mating contacts.

16. The electrical connector of claim 13, wherein the housing is conductive and provides electrical shielding for the wafers, the contact sub-assembly being received in the cavity, the housing providing electrical shielding for the wafer contacts and the mating contacts, the cavity being configured to receive a portion of a mating connector.

17. The electrical connector of claim 13, wherein the FPCBs are directly terminated to the corresponding wafers.

18. The electrical connector of claim 13, wherein the FPCBs are soldered to the corresponding wafers.

19. The electrical connector of claim 13, wherein each of the wafers include at least one signal layer and at least one ground layer, the signal and ground layers being exposed along a mating interface of the wafer, each of the FPCBs having at least one signal layer and at least one ground layer, the signal and ground layers of the FPCB being exposed along a mating interface of the FPCB, the signal layer of the FPCB having traces being soldered to corresponding traces of the signal layer of the wafer, the ground layer of the FPCB being soldered to the ground layer of the wafer.

20. An electrical connector comprising:
a housing having a cavity;
a wafer stack received in the cavity, the wafer stack comprising a plurality of electrical wafers arranged parallel to each other within the cavity, each wafer including a first edge and a second edge, each wafer including at least one trace between the first and second edges;
a contact sub-assembly terminated to the wafer stack, the contact sub-assembly comprising a rigid printed circuit board (RPCB) having a first side and a second side, the contact sub-assembly comprising wafer contacts extending from the first side of the RPCB and mating contacts extending from the second side of the RPCB, the contact sub-assembly being terminated to the wafer stack such that the wafer contacts are terminated to corresponding traces of the wafers of the wafer stack; and
a flex harness comprising a plurality of flexible printed circuit boards (FPCBs), the FPCBs having traces, the FPCBs being terminated to the contact sub-assembly such that the traces are electrically connected to corresponding mating contacts; wherein the traces of the FPCBs are electrically connected to corresponding traces of the wafers via the contact sub-assembly.

* * * * *